United States Patent [19]

Tanaka

[11] Patent Number: 5,241,501
[45] Date of Patent: Aug. 31, 1993

[54] SEMICONDUCTOR MEMORY DEVICE FOR DETECTING DEFECTIVE MEMORY CELLS IN A SHORT TIME

[75] Inventor: Shinji Tanaka, Hyogo, Japan

[73] Assignee: Mitsubishi Denki Kabushiki Kaisha, Tokyo, Japan

[21] Appl. No.: 598,875

[22] Filed: Oct. 19, 1990

[30] Foreign Application Priority Data

Oct. 30, 1989 [JP] Japan .................... 1-283358

[51] Int. Cl.⁵ ............................................. G11C 11/34
[52] U.S. Cl. ................................. 365/201; 365/200; 371/21.1
[58] Field of Search .............. 365/200, 201, 189.11, 365/230.06; 371/21.1

[56] References Cited

U.S. PATENT DOCUMENTS

| | | | |
|---|---|---|---|
| 3,760,368 | 9/1973 | Dailey et al. | 395/275 |
| 4,326,290 | 4/1982 | Davis et al. | 371/21.1 |
| 4,464,750 | 8/1984 | Tatematsu | 371/21.2 |
| 4,920,515 | 4/1990 | Obata | 365/201 X |

FOREIGN PATENT DOCUMENTS 0283907  3/1988  European Pat. Off. .

OTHER PUBLICATIONS

Kazutami Arimoto et al., "A 60ns 3.3V 16Mb DRAM", IEEE International Solid-State Circuits Conference, Session 16: Dynamic RAMs, pp. 244-245, Feb. 17, 1989.
IEEE Publication entitled "A 90ns 1Mb DRAM with Multi-bit Test Mode", IEEE International Solid-State Conference, 1985, by Kumanoya et al.

Primary Examiner—Joseph A. Popek
Attorney, Agent, or Firm—Lowe, Price, LeBlanc & Becker

[57] ABSTRACT

A DRAM with a word line shifting circuit (6) is disclosed. In an externally specified test mode, a word line shifting circuit sequentially selects two word lines ($WL_i$, $WL_{i+1}$) A test data stored in a memory cell (101) is shifted through bit lines (BL, $\overline{BL}$) to an adjacent other memory cell (102). This shifting operation is repeated between two adjacent memory cells. By comparing the repetitive shifted test data with the primarily supplied test data, the detection of whether or not a defective memory cell exists in the memory cell connected to the bit lines is accomplished in a short time.

16 Claims, 14 Drawing Sheets

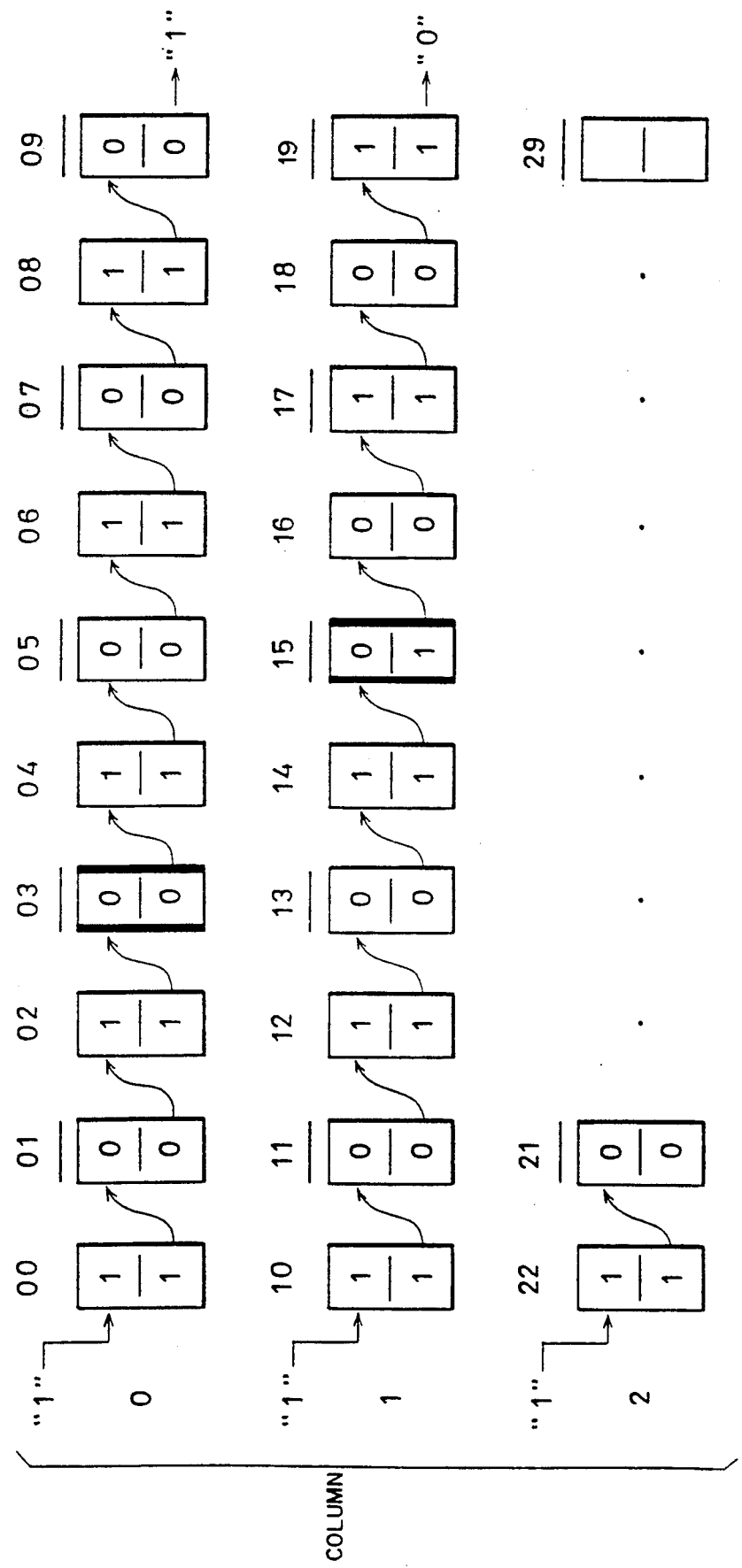

SEMICONDUCTOR MEMORY DEVICE FOR DETECTING DEFECTIVE MEMORY CELLS IN A SHORT TIME

BACKGROUND OF THE INVENTION

1. Field of the Invention

The invention generally relates to semiconductor memory devices, and more particularly to an improved circuit for detecting the existence of a defective memory cell in a semiconductor memory device in a short time. The present invention has particular applicability to dynamic random access memory devices.

2. Description of the Background Art

In manufacturing of semiconductor memories, a final test (shipment test) is performed on the memory cells after they are packaged in order to check that the manufactured memory devices will operate correctly. With the final test, it is confirmed that there are no defective memory cells in the memory devices. Briefly, predetermined test data is written into all the memory cells from which the read out data is compared with the written test data. When all the memory cell data read out coincides with the test data, it is concluded that the memory device is normal and may be shipped. However, if a non-coincidence is found in even one memory cell, that memory device is considered to be defective.

Final tests such as those mentioned above are required to be performed on dynamic random access memories (hereinafter referred to as "DRAM") as well as to static random access memories (hereinafter referred to as "SRAM"). However, in the following description, a DRAM will be used as an example.

FIG. 7 is a block diagram of a conventional DRAM 30a. The DRAM 30a of FIG. 7 is shown in U.S. Pat. No. 4,464,750, for example. Referring to FIG. 7, the DRAM 30a comprises a memory array 1 constituted by a number of memory cells, an address buffer 31 for receiving an external address signal ADR, a row decoder 2 and a column decoder 5 responsive to an internal address signal provided from the address buffer 31 for specifying a memory cell in the memory array. A sense amplifier 3 amplifies a data signal from a selected row of memory cells. An input/output buffer 33 receives and provides the data signals via the I/O line to external devices. A control circuit 32 is responsive to externally applied timing signals such as a row address strobe signal $\overline{RAS}$, a column address strobe signal $\overline{CAS}$, a write control signal $\overline{W}$ etc. for generating various internal control signals.

A memory tester 35 is connected to the DRAM 30a for executing the final test. The memory tester 35 comprises an address generator 36 for generating an address signal ADR, a test data generator 37 for generating test data D, a comparator 38 for comparing the generated test data D and data Q provided from the DRAM 30, and a control signal generator 39. The control signal generator 39 provides signals $\overline{RAS}$, $\overline{CAS}$, and $\overline{W}$ to the DRAM 30.

FIG. 8 is a timing diagram for explaining the test operation of the previously mentioned final test. In the following, the test operation will be described referring to FIGS. 7 and 8.

Firstly, at period 91, a row decoder 2 and a column decoder 5 specify a memory cell in response to an external address signal ADR. At the same time, a predetermined test data Dw is externally supplied to an input buffer 33. The supplied input data D is provided to the specified memory cell through the I/O line into which the data Dw is written. Next, at period 92, the row decoder 2 and the column decoder 5 again specify the same memory cell, from which data Qr is read out. In other words, test data Dw is written into a selected memory cell at period 91 and data Qr is immediately read out during the following period 92. The written data Dw and the read out data Qr are compared with each other to determine whether the specified memory cell is defective or not by checking its coincidence or non-coincidence. Similarly, the writing and reading of the test data are performed on another memory cell at periods 93 and 94.

When the time required to write data into a specified memory cell, i.e. the memory cycle, is Tw, and the time required to read out the data from the specified memory cell is Tr, the total time TT required to carry out the above write/read test for n memory cells is expressed in the following equation, assuming that Tw=Tr:

$$TT = n \times (Tw + Tr) \quad (1)$$
$$= 2 \cdot n \cdot Tw \quad (2)$$

There is a problem that the achievement of the final test requires a long period of time when conventional configured circuits are utilized. Particularly, an increase in storage capacity of recent memory devices directly cause an expansion of the test time, as can be appreciated from equation (1).

In order to correctly detect the existence of a defective memory cell, the afore mentioned write/read test must be carried out regarding two test data "0" and "1". This means that two times the time of the total time period TT expressed by equation (2) is necessary.

Referring to FIG. 9, the required testing time will be explained hereinafter presuming that the DRAM comprises 30 memory cells. The DRAM of FIG. 9 comprises a memory array 1 including 30 memory cells of 00-29, a row decoder 2, a sense amplifier 3, an I/O gate circuit 4, a column decoder 5, and a precharge circuit 7. When the time period Tw required for data writing and the time period Tr required for reading are each presumed to be 200n sec (Tw =Tr=200n sec), the total time period TT₁ represented by the following equation is required for the test operation, that is to say, for carrying out writing and reading of test data "0" and "1".

$$TT_1 = 2 \times (200 \times 30 + 200 \times 30) \times 10^{-9}$$
$$= 24 \, \mu \, \text{Sec}$$

Regarding a DRAM having 1M (=1,048,576) bits, the total time period TT₂ represented by the following equation is required for carrying out the test operation.

$$TT_2 = 2 \times 1,048,576 \times (200 + 200) \times 10^{-9}$$
$$= 839 \, \text{m sec}$$

SUMMARY OF THE INVENTION

An object of the present invention is to reduce the time required to detect a defective memory cell in a semiconductor memory device.

Another object of the present invention is to reduce the time required to detect a defective memory cell in a dynamic random access memory.

A further object of the present invention is to reduce the time required to detect a defective memory cell in a static random access memory.

Another object of the present invention is to ensure the detection of an existing defective memory cell in a dynamic random access memory.

Briefly, a semiconductor memory device in accordance with the present invention has a plurality of memory cells connected to bit lines. A predetermined test data signal is stored in a first memory cell of the plurality of memory cells. The memory device comprises a detecting circuit to detect the application of a test signal for specifying a test mode, and a shifting circuit for shifting the data signal stored in the first memory cell to a second memory cell of the plurality of memory cells.

In operation, the shifting circuit shifts the data signal stored in the first memory cell directly to the second memory cell through the bit lines. Since the data signal stored in the first memory cell is used directly as a data signal to be written into the second memory cell, the provision of the data signal stored in the first memory cell to the bit line, and the shifting of the data signal provided to the bit line to the second memory cell are carried out in the same one memory cycle. As a result, the time necessary for the testing is reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3B and 3C are data transition diagrams for explaining the data shifting operation in the DRAM of FIG. 3A.

DESCRIPTION OF THE PREFERRED EMBODIMENTS

Figure 1:
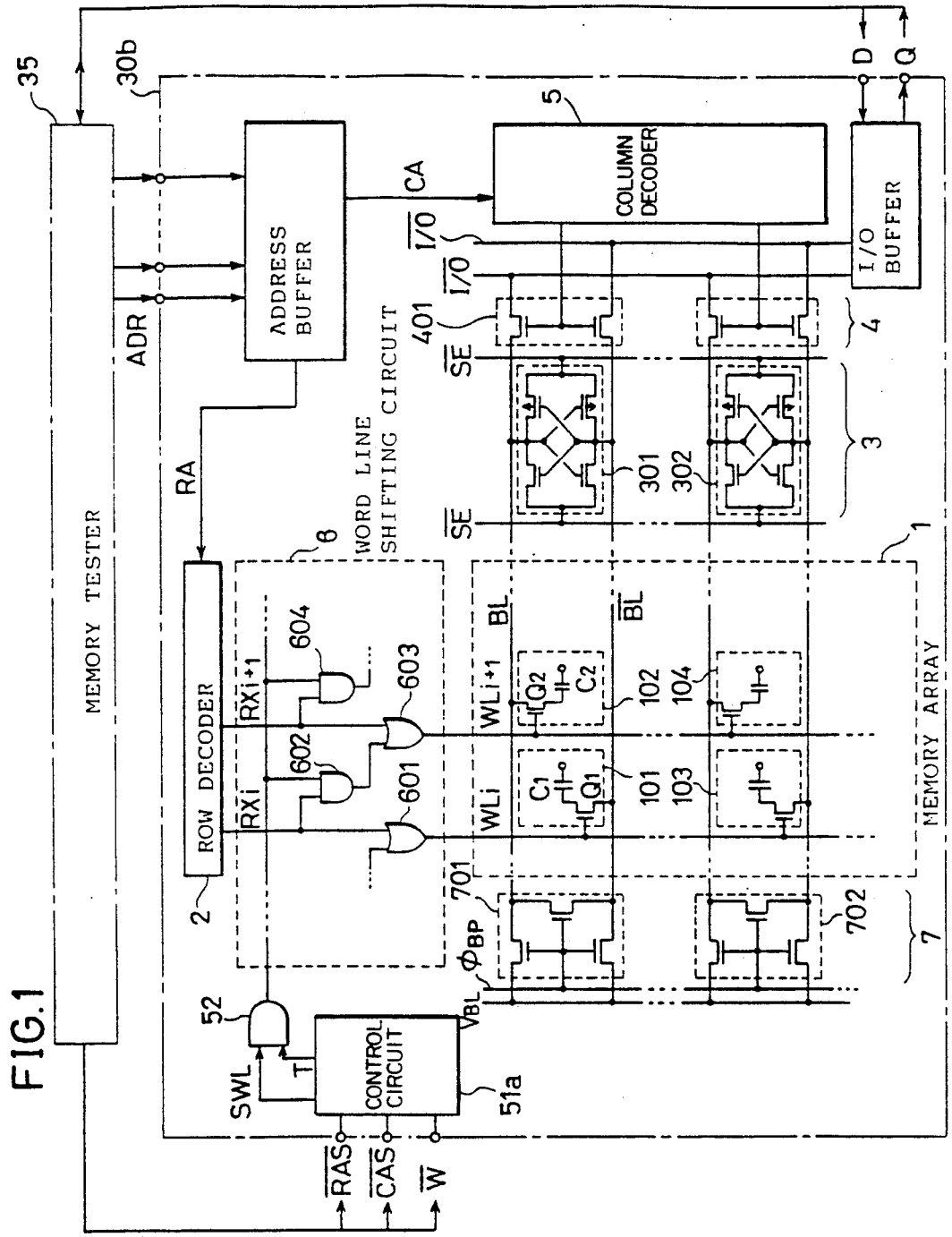
FIG. 1 is a circuit diagram of a DRAM showing an embodiment of the present invention.

Referring to FIG. 1, the DRAM 30b has a word line shifting circuit 6 connected between a memory array 1 and a row decoder 2. A control circuit 51a recognizes the external specification of the test mode in response to the particular timings of signals $\overline{RAS}$ and $\overline{CAS}$ to provide a test signal T.

The word line shifting circuit 6 is operable in a test mode to supply a row selecting signal $RX_i$ to word line $WL_i$ and to the immediately adjacent line $WL_{i+1}$. The word line shifting circuit 6 comprises an OR gate 601 to receive a row selecting signal $RX_i$ from the row decoder 2 for selecting the i-th word line $WL_i$, an OR gate 603 to receive a row selecting signal $RX_{i+1}$ for selecting the (i+1)-th word line $WL_{i+1}$, an AND gate 602 to receive an output signal of an AND gate 52 and a row selecting signal $RX_i$, and an AND gate 604 to receive an output signal of the AND gate 52 and the row selecting signal $RX_{i+1}$. The AND gate 52 is connected so as to receive a test mode signal T and a word line shift command signal SWL from the control circuit 51a. The control circuit 51a is responsive to the various timings of signals $\overline{RAS}$, $\overline{CAS}$, and $\overline{W}$ for generating signals T and SWL.

The memory array 1 comprises a memory cell 101 connected to word line $WL_i$ and bit line $\overline{BL}$, and a memory cell 102 connected to word line $WL_{i+1}$ and bit line BL. As for other columns, memory cells 103 and 104 connected to another bit line pair and word lines $WL_i$ and $WL_{i+1}$ are shown. Memory cell 101 comprises a capacitor C1 for storing the signal charge and a NMOS transistor Q1 for switching. Similarly, a capacitor C2 and a NMOS transistor Q2 are provided in memory cell 102. The bit line pair BL and $\overline{BL}$ have a sense amplifier 301 connected to amplify the data signals read out from the memory cells. The sense amplifier 301 is activated in response to sense amplifier activation signals $\overline{SE}$ and SE. Each bit line BL and $\overline{BL}$ is connected to I/O line and $\overline{I/O}$ line respectively through an I/O gate circuit 401. The I/O gate circuit 401 operates in response to a column selecting signal provided from the column decoder 5. On the other side, the bit line pair BL and $\overline{BL}$ has its end connected to a precharge circuit 701. The memory tester 35 is connected to DRAM 30b for testing this DRAM 30b. The memory tester provides control signals $\overline{RAS}$, $\overline{CAS}$, and $\overline{W}$, address signal ADR, and test data D necessary for executing the test explained hereinafter to the DRAM 30b. The memory tester 35 also compares the provided test data D and data Q read out from the DRAM 30b.

Figure 2A:
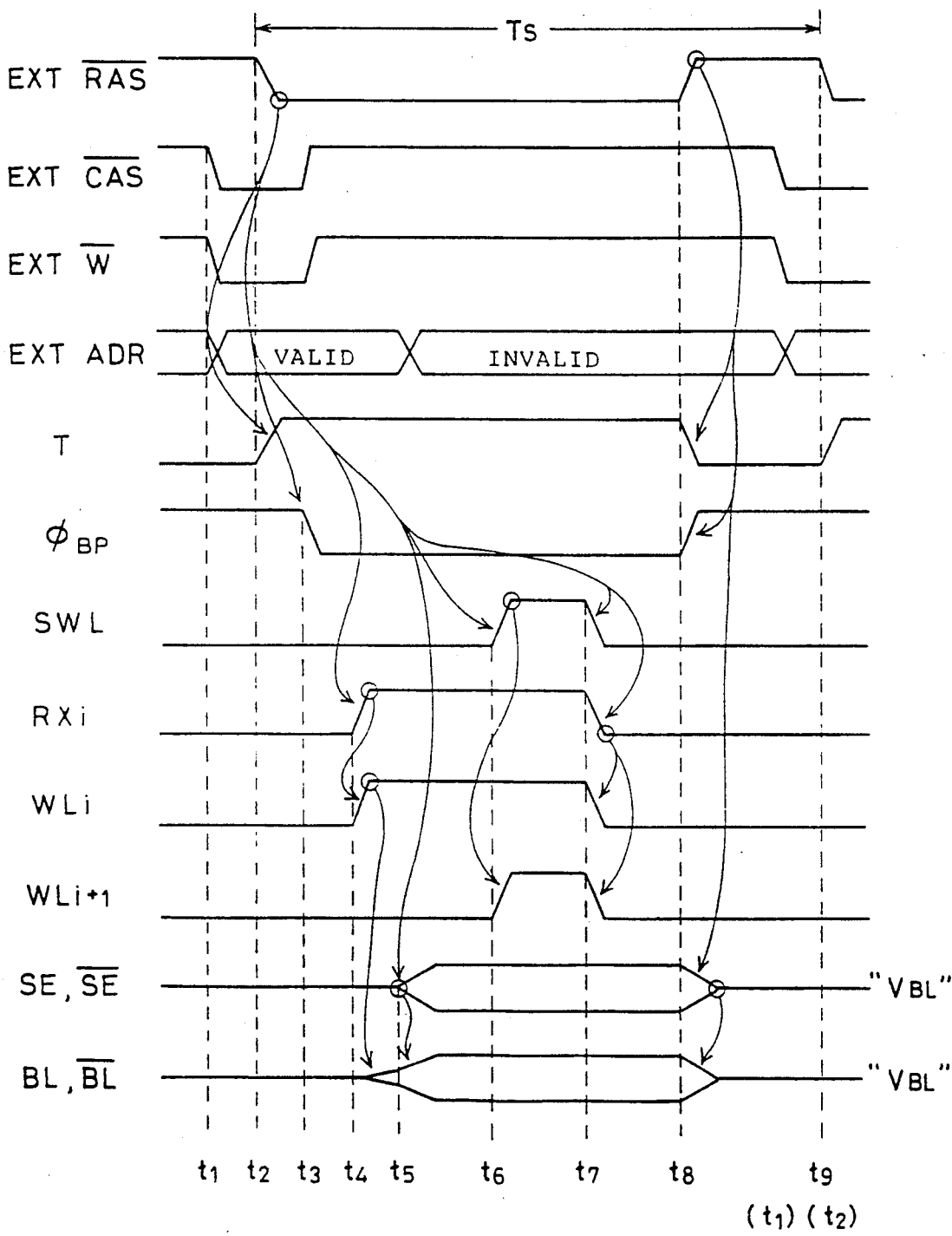
FIG. 2A is a timing diagram for explaining the operation of the circuit shown in FIG. 1.

Referring to FIGS. 1 and 2A, the shift operation of the signal charge will be described. Firstly, the control circuit 51a detects that a test mode is externally specified, by detecting the following varying timings of signals $\overline{RAS}$, $\overline{CAS}$ and $\overline{W}$. At time $t_1$, signals $\overline{CAS}$ and $\overline{W}$ fall. Next, at time $t_2$, also signal $\overline{RAS}$ falls. The control circuit 51a responds to the fall of these signals and recognizes that a test mode is externally specified to provide a signal T of the high level. In other words, when signal $\overline{RAS}$ falls subsequent to signals $\overline{CAS}$ and $\overline{W}$, the control circuit 51a recognizes that a test mode is externally specified. The DRAM 30b responds to the high level signal T to initiate a test mode operation, as will be described hereinafter. An external address signal ADR for specifying the row address i is already supplied.

At time $t_3$, the precharge signal $\phi_{BP}$ falls. The precharge circuit 701 responds to the signal $\phi_{BP}$ for bringing the bit line pair BL and $\overline{BL}$ to a floating state with a predetermined precharge potential $V_{BL}$. At time $t_4$, a word line selecting signal $RX_i$ for activating the i-th word line $WL_i$ rises. As the OR gate 601 brings the word line $WL_i$ to the high level, the transistor Q1 is turned on. This results in the signal charge stored in the capacitor C1 being applied to the bit line $\overline{BL}$, generating a small potential difference between the bit line pair BL and $\overline{BL}$. At time $t_5$, the sense amplifier activation signals SE and $\overline{SE}$ are activated so that the sense amplifier 301 amplifies the small potential difference.

At time $t_6$, a shift command signal SWL rises. The AND gate 52 provides a high level signal in response to the rise of signal SWL. At this time point, only the row selecting signal $RX_i$ is at the high level, so the AND gate 602 provides a high level signal. Therefore, the OR gate 603 brings the word line $WL_{i+1}$ to the high level. Since this causes the switching transistor Q2 in memory cell 102 to be turned on, the signal charge on bit line BL which is amplified by the sense amplifier 301 is stored in the capacitor C2 via transistor Q2.

At time $t_7$, the row selecting signal $RX_i$ and the shift command signal SWL fall, causing the OR gates 601 and 603 to produce low level signals. This will turn off the switching transistors Q1 and Q2 of memory cells 101 and 102 to retain the signal charge in each of the capacitors C1 and C2. At time $t_8$, signal $\overline{RAS}$ rises, as well as the precharge signal $\phi_{BP}$. The sense amplifier activation signals SE and $\overline{SE}$ will alter to the precharge level $V_{BL}$ for inactivating the sense amplifier 301. The bit line pair BL and $\overline{BL}$ are also precharged to the potential $V_{BL}$. Thus, one shift cycle of the signal charge in accordance with the test mode operation is completed. After time $t_9$, the next shift cycle will commence. The similar shift control will be sequentially carried out in the following shift cycles. By repeating the shift operation, all the memory cells connected to one bit line pair BL and $\overline{BL}$ may have their signal charge shifted.

Figure 2B:
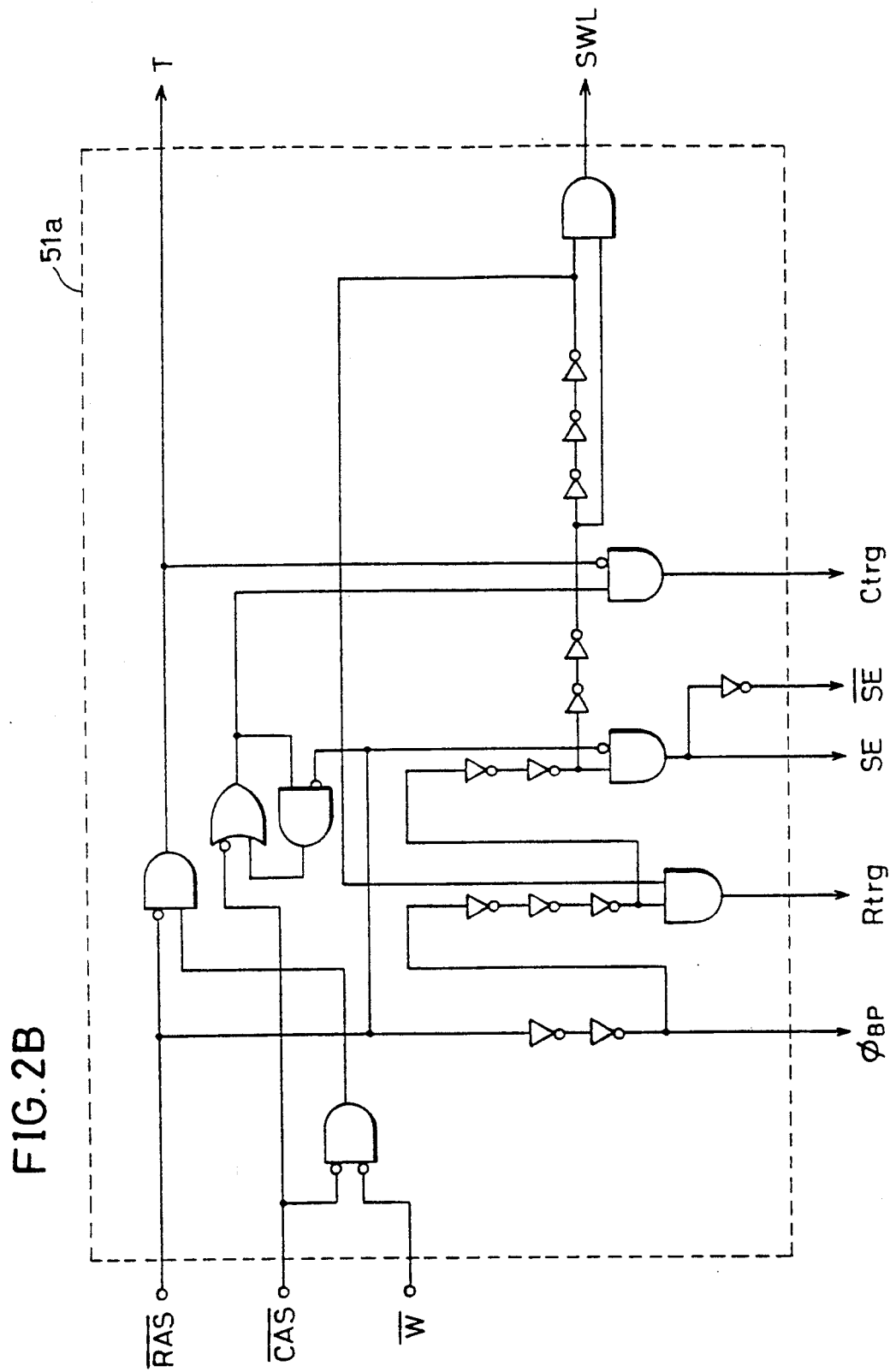
FIG. 2B is a circuit diagram of the control circuit of FIG. 1.

An example of the control circuit 51a generating various control signals of FIG. 2A is shown in FIG. 2B. The control circuit 51a generates trigger signal Rtrg for row selection and trigger signal Ctrg for row selection, although not shown in FIG. 1. Signal Rtrg is applied to the row decoder 2, whereas signal Ctrg is applied to the column decoder 5.

The above shifting operation of the signal charge may be performed for each bit line pair simultaneously in the memory array 1. In other words, the data signals stored in the memory cells 101 and 103 connected to each bit line pair are shifted along the bit line pairs. It should be noted that a row address signal is necessary for the purpose of specifying a word line for the above shift control, but a column address signal is not required.

From the above description, it will be appreciated that the following relationship is established for the i-th and (i+1)-th signal level, provided that $1 \leq i < n$:

$$WL_1 = RX_i \quad \ldots (3)$$

$$WL_{i+1} = RX_{i+1} \cup (RX_i \cap T \cap SWL) \quad \ldots (4)$$

Figure 3A:
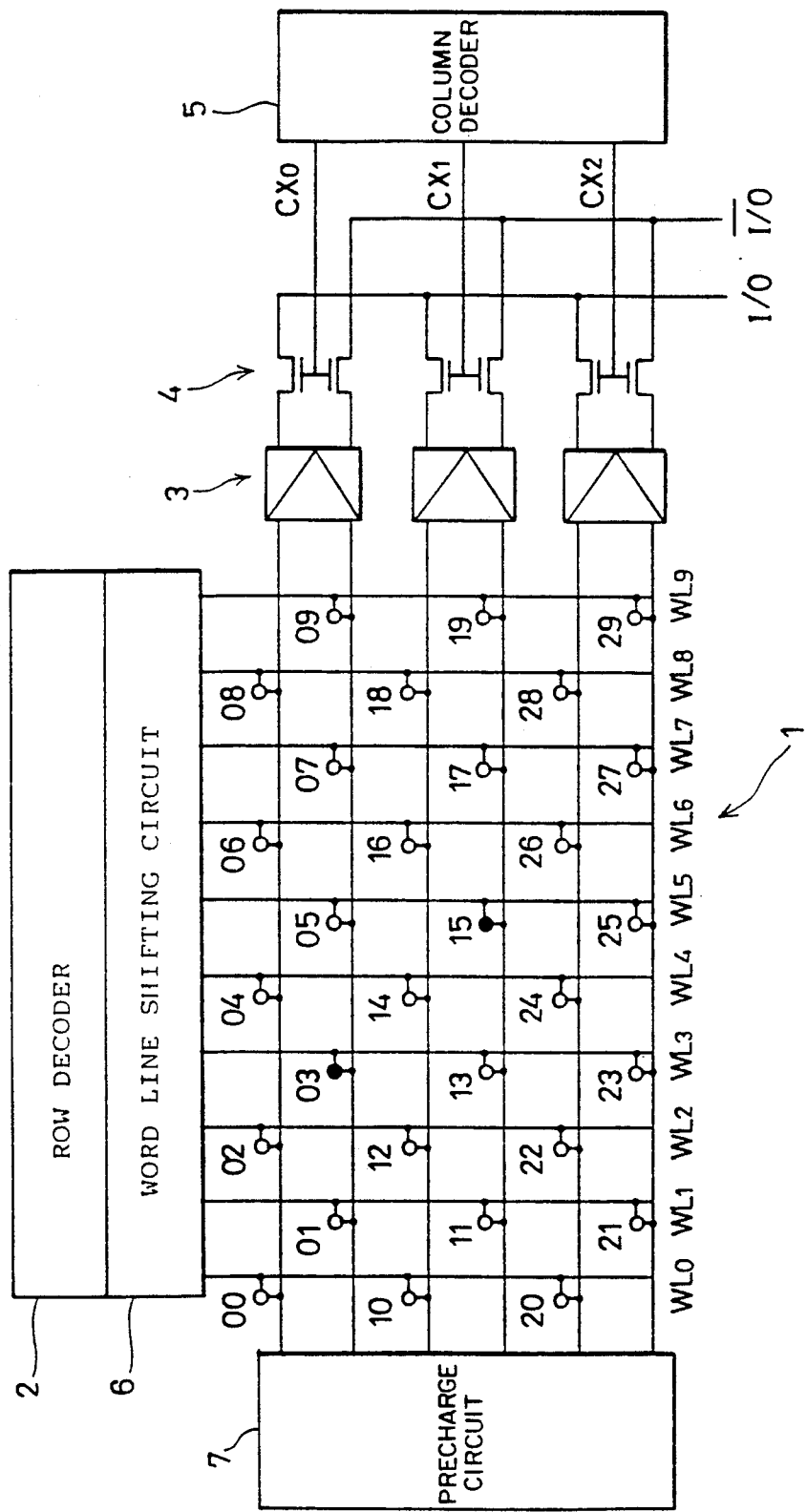
FIG. 3A is a schematic diagram for explaining the shifting operation of the DRAM shown in FIG. 1.

A schematic diagram for explaining the above shifting operation utilizing test data from a general standpoint is shown in FIG. 3A. In order to simplify the description in FIG. 3A, a memory array with 30 memory cells is illustrated. Referring to FIG. 3A, the DRAM comprises a memory array 1 having memory cells 00-29, a row decoder 2 for selecting word lines $WL_0$-$WL_9$, a word line shifting circuit 6, a precharge circuit 7 for precharging each bit line pair, a sense amplifier 3 for amplifying the small potential difference between each bit line, a column decoder 5 to provide column selecting signals $CX_0$-$CX_2$ for selecting a bit line pair, and an I/O gate circuit 4 responsive to column selecting signals $CX_0$-$CX_2$ for selectively connecting a bit line pair to the I/O line pair. In the following description, it is assumed that memory cells 03 and 15 are defective, and these memory cells 03 and 15 will provide a fixed data "0" and "1".

At the first step, test data "0" is written into memory cells 00, 10, and 20 under a normal write mode.

At step 2, one cycle of the shift operation is carried out for the 0-th row. This causes the inverted data "1" to be written into memory cells 01, 11, and 21. By repeating the shift cycle in a similar manner, the shifting operation is performed towards memory cells 09, and 29 which are connected to the 9-th word line $WL_9$. However, the test data that should be shifted during this shifting operation is altered due to the fact that memory cell 03 is damaged. Memory cell 03 will always provide data "0" because of its defect. Consequently, data "0" will eventually be stored in memory cell 09. The other damaged memory cell 15 will always provide the data "1", so the test data is not altered at this stage.

At step 3, the data stored in memory cells 09, 19 and 29 are read out under the normal read out mode. Since data "0" is read out from memory cell 09, it is determined that there is a defect in one of the memory cells connected to the bit line pair of which memory cell 09 is connected.

At step 4, the same operation as in the above steps 1-3 is carried out of test data "1". Firstly, test data "1" is supplied to memory cells 00, 10, and 20. In this case, memory cell 15 is defective, so data "1" will be eventually stored in memory cell 19. As a result, it is determined that there is a defective memory cell in memory cells 10-19 which are connected to the bit line pair connected to memory cell 19.

Figure 3B:
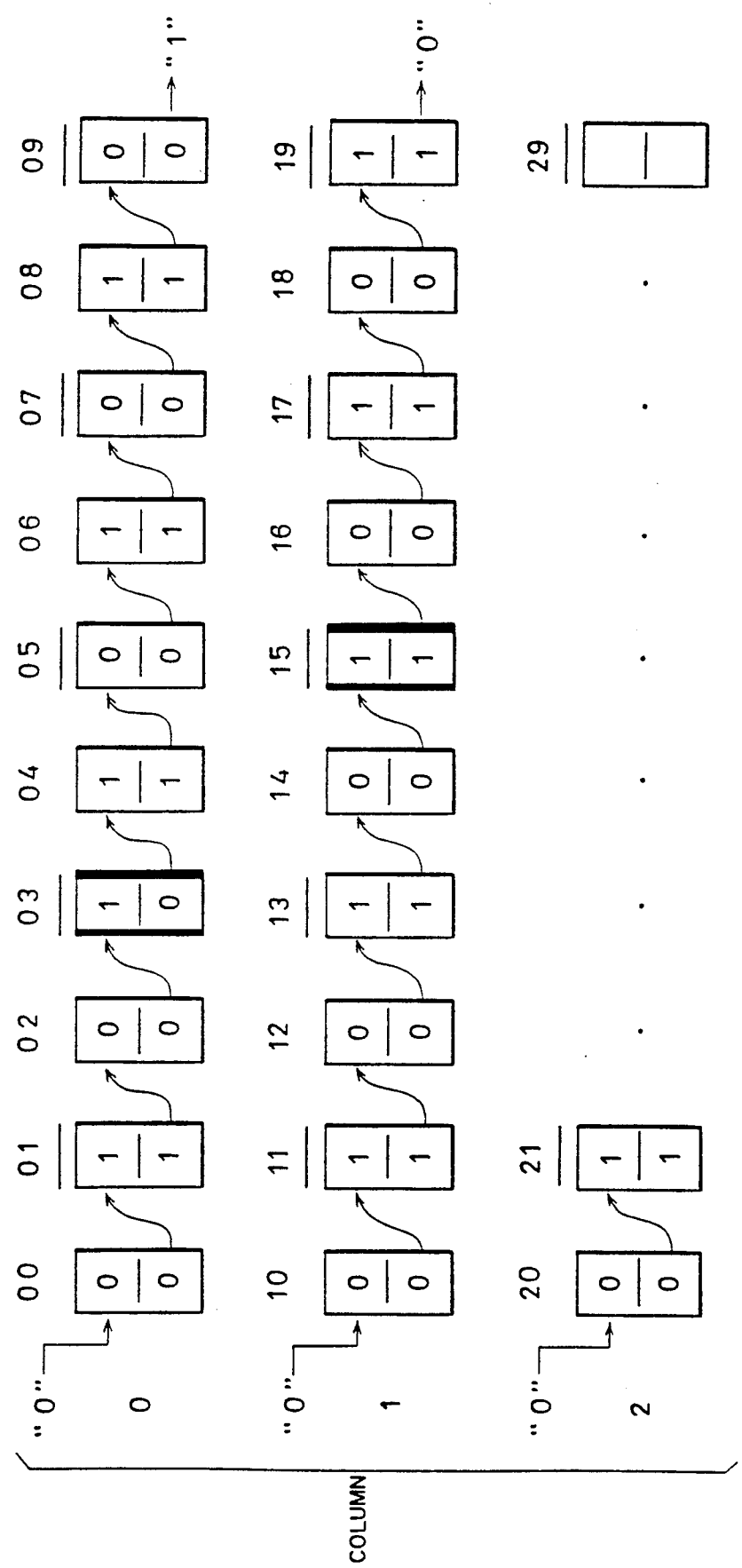

For the purposes of clarity, the inversed manner of the data signal caused by the shifting operation of the data is shown in FIGS. 3B and 3C. FIG. 3B shows the case where test data "0" is first written into memory cells 00,10 and 20. FIG. 3C shows the case where test data "1" is written into memory cells 00,10, and 20. Referring to FIG. 3B, data "0" is written into memory cell 00, for example, and data "0" is shifted to memory cell 01. Data "0" shifted from memory cell 00 is written into memory cell 01 as data "1". In a similar manner, data "0" shifted from memory cell 02 is written into memory cell 03 as data "1". However, memory cell 03 always provides data "0". Memory cell 03 therefore causes data invertion. The data shifted from memory cell 03 is written into memory cell 04 as data "1". Data "0" stored in memory cell 09 is eventually read out as data "1". Thus, the existence of a defective memory cell within memory cells 00-09 on column 0 is detected, resulting from data "0" first written into memory cell 00 not coinciding with the last read out data "1".

On the other hand, the defective memory cell 15 on column 1 always provides data "1", which means that the first written data "0" coincides with the last read out data "0". Therefore, the existence of a defective memory cell on column 1 can not be detected in the case of FIG. 3B.

However, the existence of a defective memory cell on column 1 can be detected by carrying out similar shifting operation using data "1" as the first data, as shown in FIG. 3C. Data "1" shifted from memory cell 14 is written into memory cell 15 as data "0". Because memory cell 15 always provides data "1", data invertion occurs in memory cell 15. As a result, data "1" stored in memory cell 19 is read out eventually as the last data "0". The existence of a defective memory cell is thus detected because the first data "1" does not coincide with the last data "0".

The time period required for carrying out the above mentioned test will be described hereinafter regarding a DRAM having 30 memory cells. The time required for respective writing, reading, and shifting of data is each presumed to be 200n sec in the description hereinafter for the purpose of simplifying the calculation. Test data "0" is written into each of memory cells 00,10, and 20 shown in FIG. 3A. This takes a time period of 200n sec×3. By one shifting operation, the data stored in memory cells 00,10, and 20 are shifted into memory cells 01,11, and 21. The total of 9 shifting operation is necessary for shifting the data to the last memory cells 09,19, and 29. Therefore, this takes 200 n sec×9. The reading operation is repeated three times for reading the data stored in each of memory cells 09, 19, and 29. This takes 200n sec×3. The afore mentioned test with test data "0" is carried out, followed by a similar test with test data "1". Thus, the total time period $TT_1'$ represented by the following equation is necessary.

$$TT_1' = 2 \times (3 \times 200 + 9 \times 200 + 3 \times 200) \times 10^{-9}$$
$$= 6 \mu \text{ sec}$$

Figure 9:
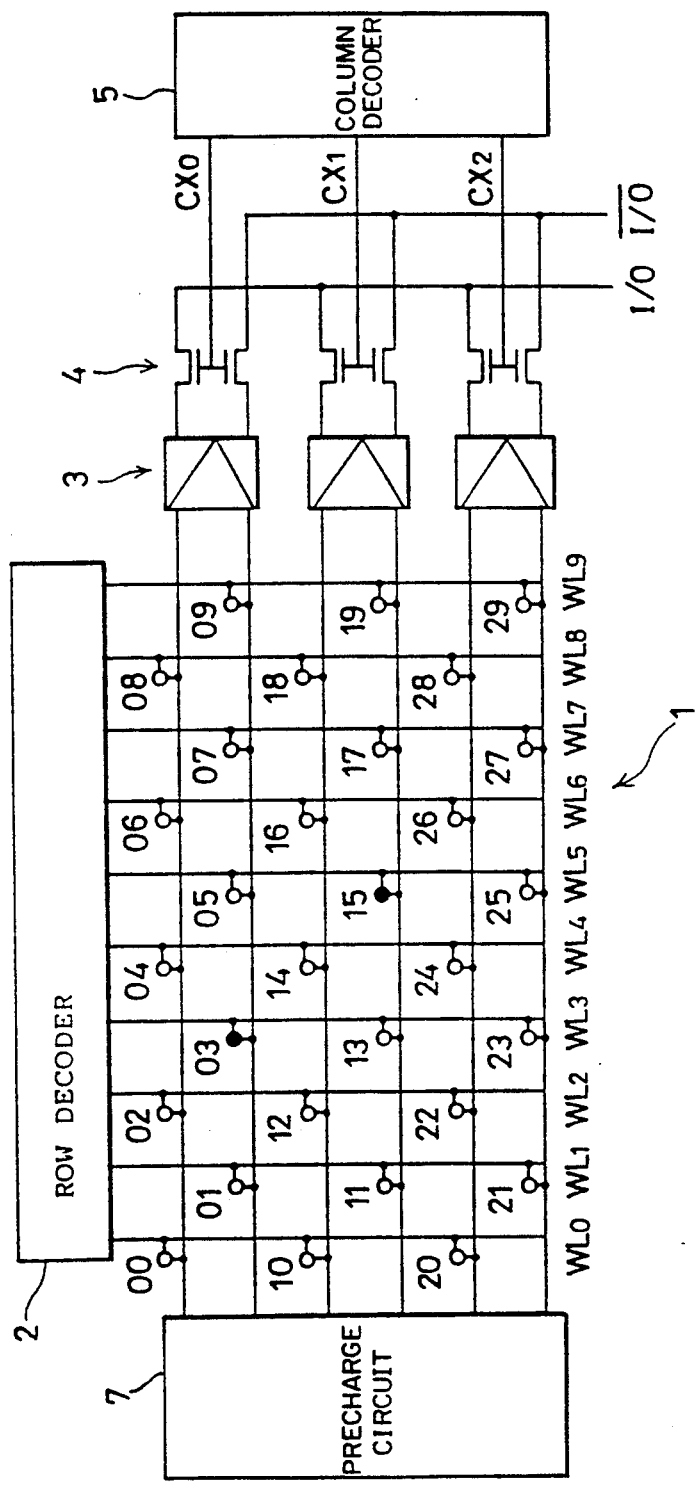
FIG. 9 is a block diagram of a conventional DRAM having memory cells of 30 bits.

Thus, it is appreciated that the total time period for testing the DRAM shown in FIG. 3A is ¼ of that of the total time period $TT_1(=24\mu$ sec) required for a conventional DRAM shown in FIG. 9.

Figure 4A:
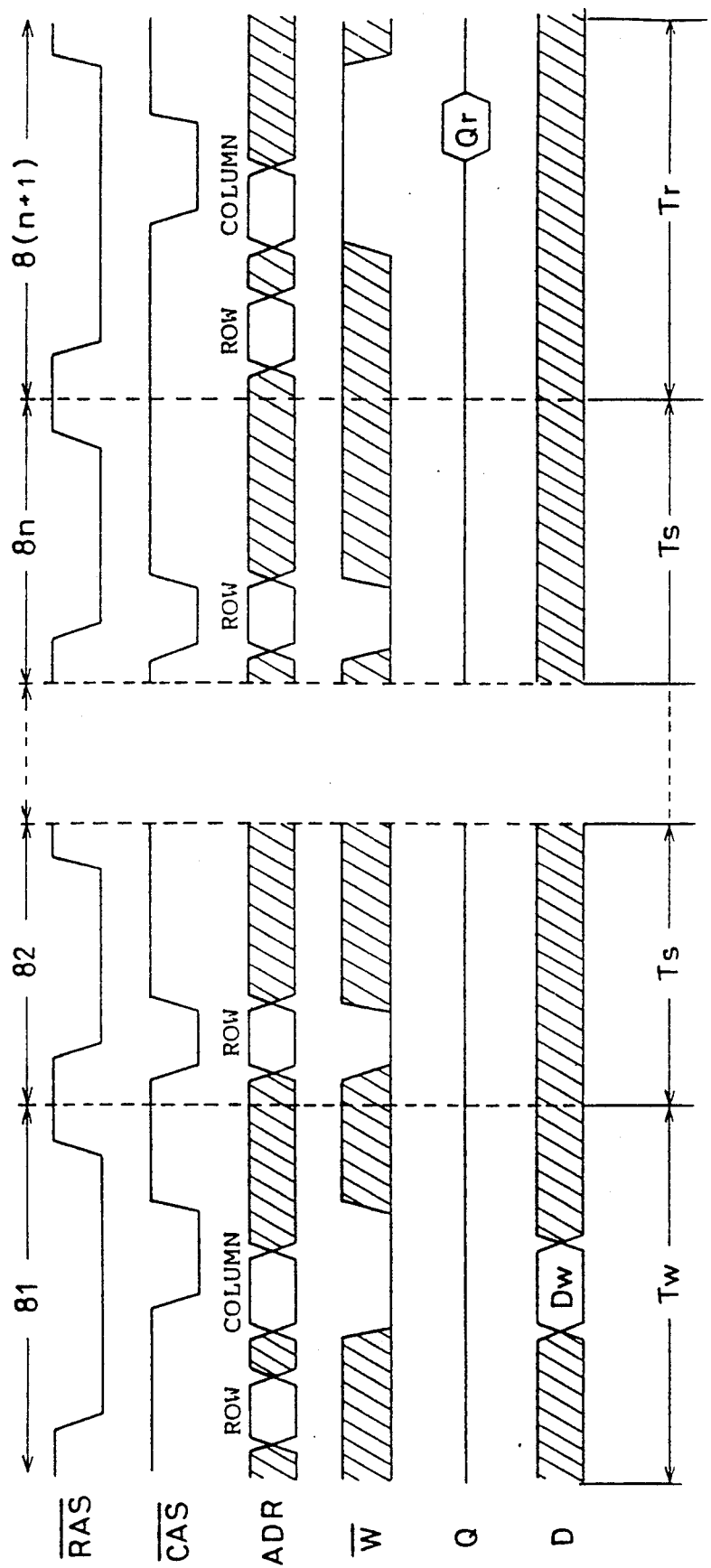
FIG. 4A is a timing diagram showing the test operation of n memory cells of the DRAM in FIG. 1.

The time required for a test operation to be carried out for n memory cells will be explained in reference to the timing diagram of FIG. 4A. At period 81, a test data is written into specific memory cells, such as memory cells 00, 10, and 20 shown in FIG. 3A under a normal write mode. It is assumed that time Tw is required to write a test data. At each period 82-8n, the previously mentioned shifting operation of the test data is performed. The time required for carrying out each shifting operation, i.e., the period of a shift cycle is Ts. At period 8(n+1), data is read out from the memory cell that has the test data eventually shifted, under a normal read out mode. It will take time Tr to read out this data. Therefore, the total time TT' required to carry out all the operations in periods 81-8(n+1) is represented by the following equation:

$$TT = Tw + (n - 1) \times Ts + Tr \quad (6)$$
$$= (n + 1) \cdot Tw \quad (7)$$

It is assumed that Tw=Tr, and Tw=Ts.

For the purpose of correctly detecting the existence of a defective memory cell, the above mentioned write/read test must be carried out with two test data "0" and "1". It is therefore noted that a time period of two times the total time period TT' expressed by equation (7) is necessary. By comparing equation (7) with equation (2), it will be noted that the time it takes to detect a defective cell is reduced to a half of its conventional time by providing a word line shifting circuit 6 of FIG. 1 in a DRAM.

Figure 4B:
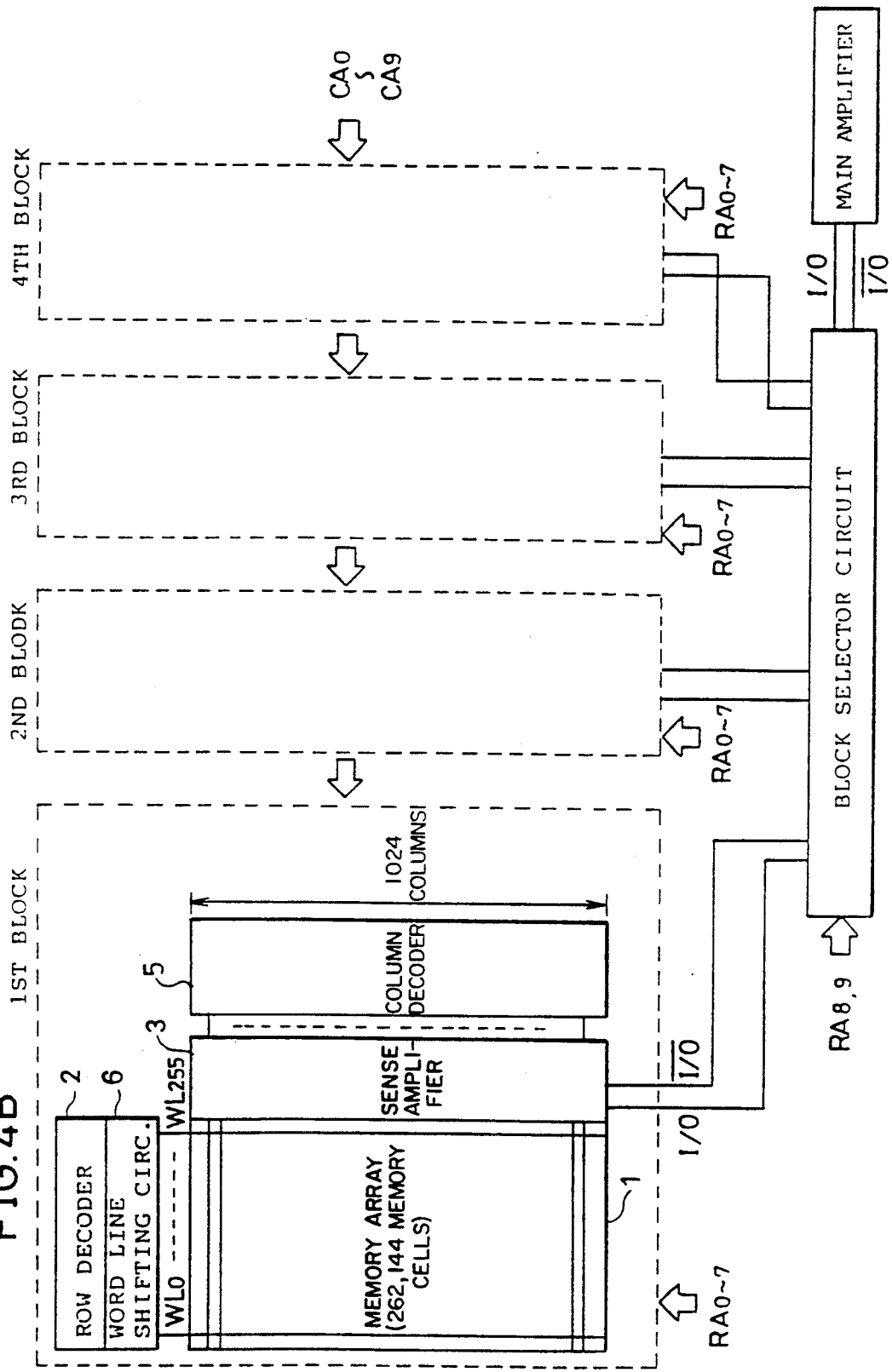
FIG. 4B is a block diagram of a 1M-bit DRAM showing another embodiment of the present invention.

A DRAM having a 1M-bit memory capacity is shown in FIG. 4B. Referring to FIG. 4B, the total time period $TT_2'$ necessary for carrying out the above mentioned test operation for a 1M-bit DRAM is explained hereinafter. As shown in FIG. 4B, the 1M-bit DRAM is divided into four blocks, each having identical circuit structure.

For example, the first block comprises a memory cell array 1 having 262,144 (=256×1024) memory cells, row decoder 2, a sense amplifier 3, a column decoder 5, and a word line shifting circuit 6. The details of each block is shown in FIG. 1. The memory cell array 1 comprises 256 word lines WL0-WL255, and 1024 columns, i.e., bit line pairs. The row decoder 2 is responsive to row address signal RA0-RA7 to select one of word lines WL0-WL255. The column decoder 5 is responsive to column address signal CA0-CA9 to select one of the 1024 columns. The block selecting circuit is responsive to more significant row addresses RA8 and RA8 to select the block where the data to be provided exists. The main amplifier amplifies the data signal selected by the block selecting circuit.

As shown in FIG. 4B, the 1M-bit DRAM comprises four blocks of the same circuit structure, wherein the shifting operation in accordance with the present invention is carried out in parallel and at the same time. In test, operation, test data "0" is written into the memory cells on the first row of each memory cell 1 in each block. Because there are 1024 memory cells on one row, this requires a time period of 819μ sec (=4×1024 ×200n sec). The data stored in the memory cells on the first row are then shifted in the direction of the memory cells on the 256-th row. This requires 255 shifting operations, taking a time period of 51μ sec (=255×200n sec). A time period of 819μ sec (=4×1024×200 n sec) is required to read out the data stored in the memory cells on the 256-th row of the 4 blocks. Similarly, the above mentioned operation is repeated for test data "1". Thus, the total time period $TT_2'$ is as follows:

$$TT_2' = 2 \times (819 + 51 + 819)$$
$$\approx 3.38 \text{ m sec}$$

It can be appreciated that the time required for testing the DRAM in accordance with the present invention is 1/250 of that of total time $TT_2$ required for a conventional 1M-bit DRAM.

Figure 5:
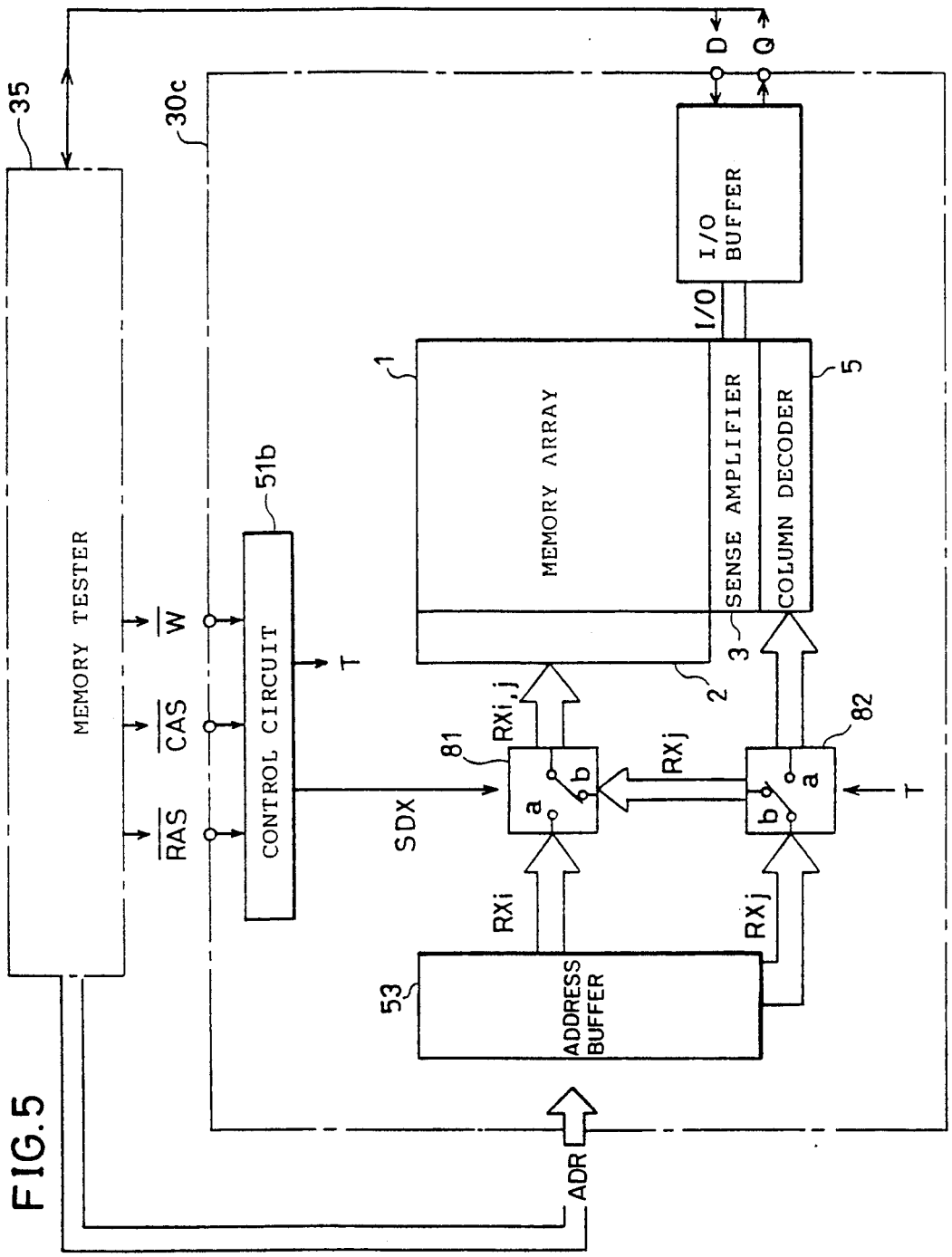
FIG. 5A is a circuit block diagram of a DRAM showing another embodiment of the present invention.

A DRAM showing another embodiment of the present invention can be seen in FIG. 5. Referring to FIG. 5, the DRAM comprises a switching circuit 81 connected between an address buffer 53 and a row decoder 2, and a switching circuit 82 connected between the address buffer 53 and a column decoder 5. A control circuit 51b responds to signals $\overline{RAS}$, $\overline{CAS}$, and $\overline{W}$ to provide a test mode signal T and a signal SDX for switching the row decoder input. The switching circuit 81 operates in response to signal SDX, while switching circuit 82 operates in response to signal T.

The switching circuit 81 is connected to the side of the terminal "a" when signal SDX is at the low level, and to the side of the terminal "b" when signal SDX is at the high level. The switching circuit 82 is connected to the side of the terminal "a" when signal T is at the low level, and to the side of the terminal "b" when signal T is at the high level. The above mentioned test mode operation of the switching circuits 81 and 82 continue until a signal instructing the termination of the test mode is applied externally from the memory tester 35.

In a normal read and write mode, the switching circuit 81 is always connected to the terminal "a" side, whereas the switching circuit 82 is always connected to the terminal "a" side. Accordingly, the DRAM shown in FIG. 5 can carry out the conventional write and read operation. In the test mode, the switching circuit 82 is always connected to the terminal "b" side, whereas the switching circuit 81 is responsive to signal SDX to be alternately connected to the terminal "a" side and the terminal "b" side. It is therefore possible to provide address signal $RX_j$ applied at the timing of the column address signal application to the row decoder 2 via the switching circuit 81. The address signal $RX_i$ input at the timing of the row address signal application specifies the memory cell row of the data source. The address signal $RX_j$ specifies the memory cell row of the data's destination. It is assumed that the test data is already stored in the memory cells on the row specified by the address signal $RX_i$ in the following description.

Figure 6A:
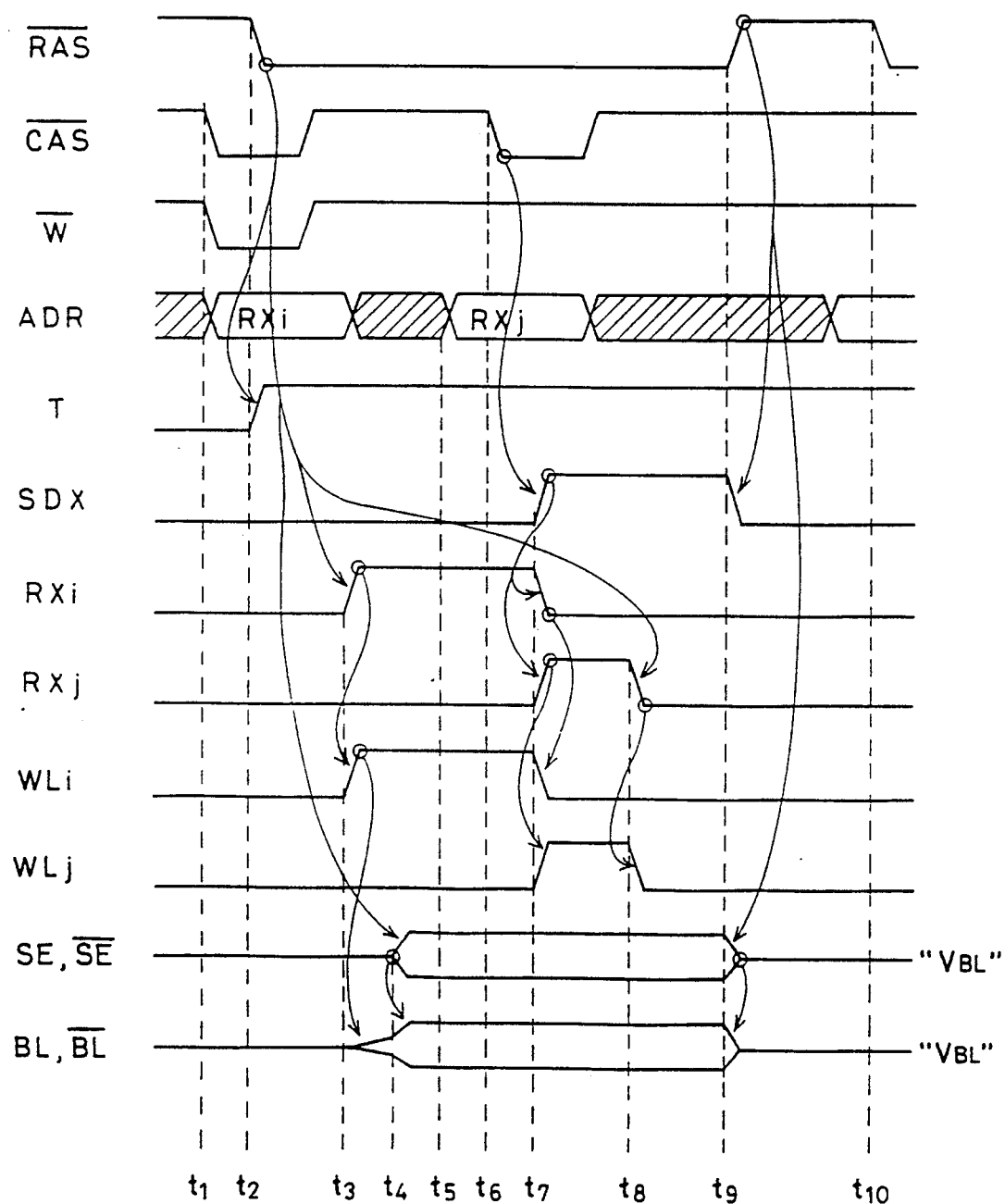
FIG. 6A is a timing diagram for explaining the operation of the DRAM shown in FIG. 5.

Referring to FIGS. 5 and 6A, the shifting operation of this DRAM will be explained. At time $t_1$, signals $\overline{CAS}$ and $\overline{W}$ fall, and an external address signal ADR indicating an internal address $RX_i$ is provided. At time $t_2$, signal $\overline{RAS}$ falls, and test mode signal T rises in response to this fall. This is the beginning of the test mode operation.

At time $t_3$, since row selecting signal $RX_i$ rises, the i-th word line $WL_i$ is brought to the high level. Consequently, the signal charges stored in the memory cells connected to the word line $WL_i$ are supplied to the bit line pairs. At time $t_4$, the sense amplifiers are activated by sense amplifier activation signals SE and $\overline{SE}$ to amplify the small potential differences between the bit line pairs.

At time $t_5$, an external address signal ADR indicating the address RXj which specifies the destination memory cells is supplied. At time $t_6$, signal $\overline{CAS}$ falls. At time $t_7$, a row decoder input switching signal SDX is raised, and the switching circuit 81 is connected to the side of the terminal b in response to this SDX signal. As a result, the row selecting signal $RX_i$ falls to bring the word line $WL_i$ to the low level. Meanwhile, the j-th row selecting signal RXj rises to bring the j-th word line WLj to the high level. As a result, the data stored in the memory cells connected to the i-th word line $WL_i$ are written to the memory cells connected to the j-th word line WLj.

At time $t_8$, row selecting signal RXj falls. Consequently, the word line WLj is brought to the low level, and the transferred data are retained in the memory cells. At time $t_9$, signal $\overline{RAS}$ rises. This causes signal SDX to fall, and the precharging of the bit line pair commences due to the fact that the bit line pair is brought to the precharge potential $V_{BL}$. The bit line pair precharging will terminate by time $t_{10}$, followed by the start of the next transfer operation for another memory cell. At this time, it is not necessary to drop signals $\overline{CAS}$ and $\overline{W}$ since the DRAM is already in the test mode.

Figure 6B:
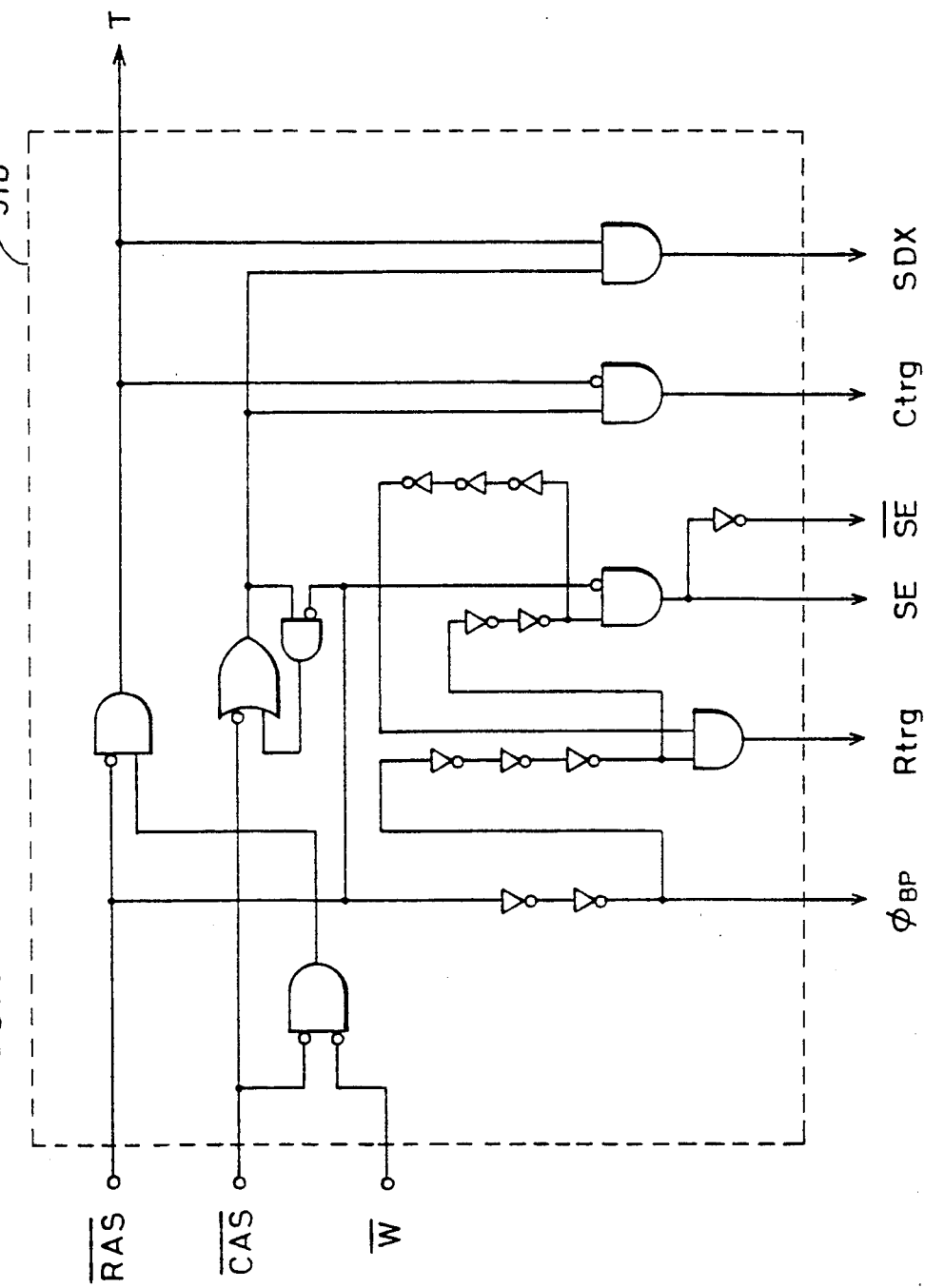
FIG. 6B is a circuit diagram of the control circuit of FIG. 5.
Figure 7:
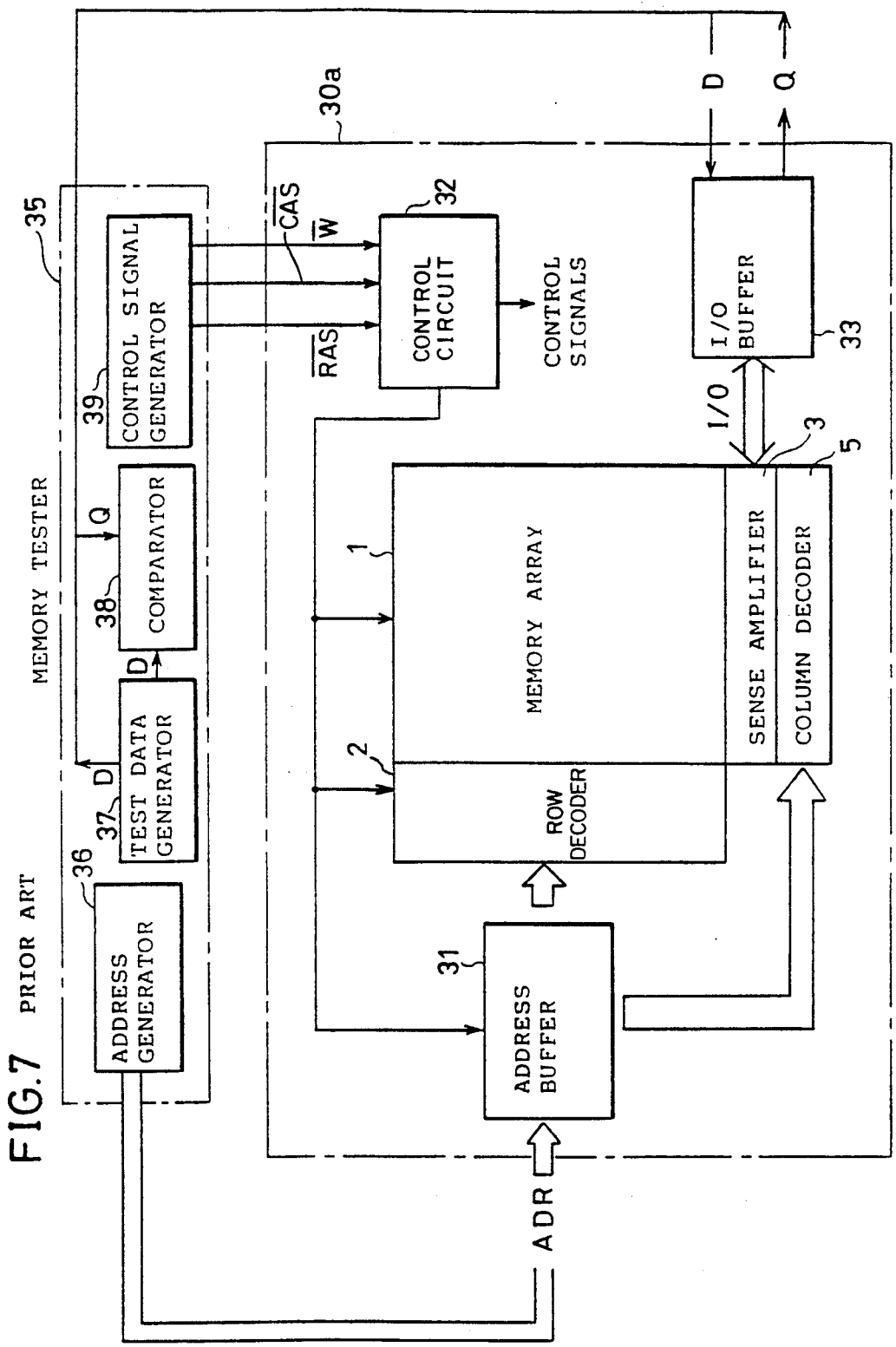
FIG. 7 is a block diagram showing the schematic configuration of a conventional DRAM.
Figure 8:
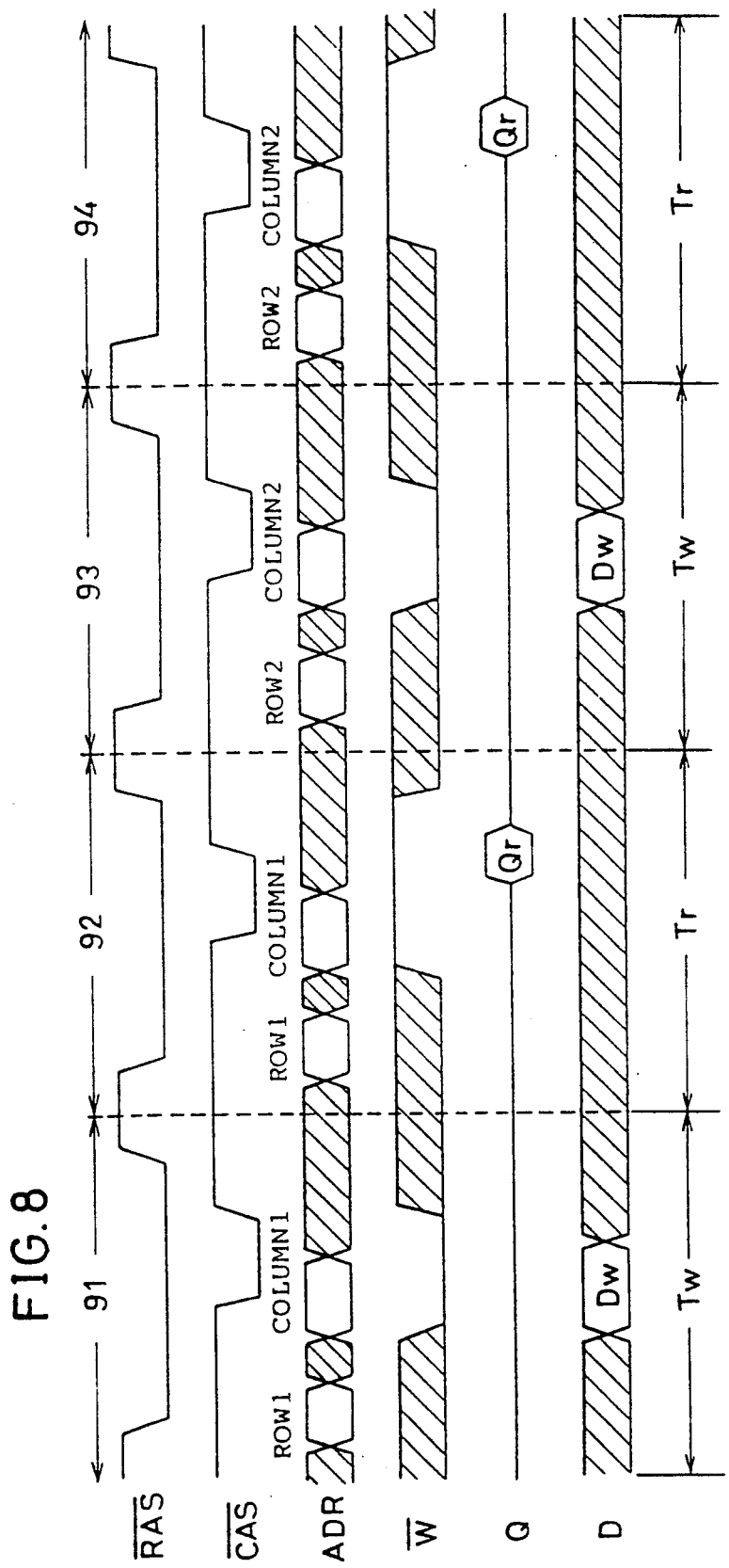
FIG. 8 is a timing diagram for explaining the test operation of the final test of the DRAM shown in FIG. 7.

An example of the control circuit 51b generating various control signals of FIG. 6A is shown in FIG. 6B.

With the above control in the DRAM shown in FIG. 5, it is possible to arbitrarily select the destination of the signal charge transfer. In other words, the shift control function implemented by the word line shifting circuit 6 is realized by providing switching circuits 81 and 82 in place of the shifting circuit 6. Some defective memory cells may not be detected by sequentially selecting mutual adjacent memory cells.

On the contrary, the DRAM shown in FIG. 5 can solve the above mentioned inconvenience because it is possible to specify any arbitrary memory cell in one RAS cycle by using an external address signal ADR. In addition, it is noted that the circuit can be realized at the minimum circuit modification without any various circuit modification since the input of the two line addresses RXi and RXj are performed by the switching control of the switching circuits 81 and 82.

It is also possible to simplify the control for address application by providing the address signal $RX_i$ indicating the source of the data and the row destination address signal $RX_j$ from the memory tester 35 on a random basis. The existence of a defective memory cell can be detected in such a case.

As has been described in detail, the DRAM of FIG. 1 has the test data stored in memory cell 101 shifted into memory cell 102 via the bit line pair BL and $\overline{BL}$ in one memory cycle Ts, as shown in FIG. 2. Test data is sequentially shifted by the shifting operation repeated for each pair of mutual adjacent memory cells. It will be understood that the time required for detecting a defective memory cell is reduced to a half of its time by comparing equations (2) with (7). Furthermore, the DRAM of FIG. 5 has the data signal shifted within one memory cycle between two arbitrary memory cells specified by an external address signal. Thus, it is possible to rapidly and reliably detect the existence of a defective memory cell. Consequently, a reduction in the time to detect a defective memory cell is achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of bit lines,
   a plurality of memory cells including first and second memory cells connected to a pair of said bit lines for storing a test data signal,
   means for storing said test data signal in the first memory cell,
   detecting means for detecting externally applied signals specifying a test mode,
   shifting means connected to said plurality of memory cells and responsive to said detecting means for shifting the data signal stored in said detecting means for shifting the data signal stored in said first memory cell to said second memory cell through said bit lines.

2. A semiconductor memory device according to claim 1, wherein said shifting means comprises:
   first specifying means connected to said plurality of memory cells and responsive to an externally applied row address signal for specifying said first memory cell,
   said first memory cell providing the data signal stored in said first memory cell to said bit lines in response to said first specifying means, and
   second specifying means connected to said plurality of memory cells and responsive to said detecting means for specifying said second memory cell,
   said second memory cell storing the data signal provided to said bit lines in response to said second specifying means.

3. A semiconductor memory device according to claim 2, wherein said shifting means further comprises:
   amplifying means connected to said bit lines for amplifying the data signal provided to said bit lines,
   said second memory cell storing the data signal amplified by said amplifying means in response to said second specifying means.

4. A semiconductor memory device according to claim 3, wherein said memory device comprises a dynamic random access memory device.

5. A semiconductor memory device according to claim 2, wherein said first and second memory cells are arranged adjacent to each other.

6. A semiconductor memory device according to claim 5, wherein said first specifying means comprises first row decoder means for decoding row address signals, said row decoder means generating a first specifying signal for specifying said first memory cell in response to the row address signal.

7. A semiconductor device according to claim 6, wherein said second specifying means comprises logical product means connected to receive signals generated from said detecting means and said row decoder means, said logical product means generating a second specifying signal for specifying said second memory cell.

8. A semiconductor memory device comprising;
a plurality of memory cells arranged in a matrix for storing data signals,
address input means for receiving first and second address signals externally provided in time division of one memory cycle,
row decoder means for decoding the first address signal provided from said address input means,
column decoder means for decoding the second address signal provided from said address input means,
address providing means connected among said address input means, said row decoder means and said column decoder means for applying said first and second address signals to said row decoder means and said column decoder means, respectively,
detecting means for detecting an application of an externally applied signal specifying a test mode,
address providing control means connected to said address providing means and responsive to said detecting means for controlling the destination of the second address signals by said address provision means.

9. A semiconductor memory device, comprising:
a plurality of memory cells including a first and a second memory cells and connected to bit lines,
first writing means connected to said bit lines for writing a predetermined test data signal in the first memory cell,
detecting means for detecting an application of an externally applied test signal specifying a test mode,
second writing means for writing the data signal written in said first memory cell to the second memory cell through said bit lines in response to said detecting means.

10. A method for detecting the existence of a defective memory cell in a semiconductor memory device including a plurality of memory cells arranged in a matrix of rows and columns, the memory cells being individually connected to bit lines along the column direction and to word lines along the row direction, the bit lines grouped into bit line pairs with successive cells in each column connected alternately to a first and second bit line of the corresponding bit line pair, said method comprising the steps of:

storing data representing a first logic level in a first memory cell of a first column,
sequentially shifting the data stored in said first memory cell to successive memory cells in said first column through the bit lines connected to said first column,
reading out the shifted data stored in a memory cell in said first column, and
comparing the value of the data read with a corresponding test value, whereby a comparison mismatch indicates at least one defective memory cell among those memory cells through which data has been shifted.

11. The method of claim 10, further including storing data representing a second logic level in said first memory cell and repeating the steps of sequentially shifting the data to the same memory cells, reading out and comparing with a second corresponding test value.

12. The method of claim 10, further including the step of generating a test signal indicative of a test mode and detecting said test signal and wherein the step of sequentially shifting is performed in response to said detecting.

13. A method for detecting the existence of a defective memory cell in a semiconductor memory device including a plurality of memory cells arranged in a matrix of rows and columns, the memory cells being individually connected to bit lines along the column direction and to word lines along the row direction, said method comprising the steps of:

storing test data representing a first logic level in a first memory cell of each column,
successively shifting the data stored in each first memory cell to the remaining memory cells in respective columns through the bit lines of said respective columns,
sequentially reading out the shifted data stored in the memory cell storing the final data shift in each column, and
comparing the value of the data read with said test data, whereby a comparison mismatch indicates at least one defective memory cell among those memory cells through which data has been shifted.

14. A method of detection according to claim 13, wherein said step of successively shifting is performed sequentially through adjacent rows.

15. A method of detection according to claim 13, wherein said step of successively shifting is performed to successive rows on a random basis.

16. A semiconductor memory device, comprising:
a plurality of bit lines,
a plurality of memory cells including first and second memory cells connected to a pair of said bit lines for storing a test data signal,
means for storing said test data signal in the first memory cell,
detecting means for detecting externally applied signals specifying a test mode,
shifting means connected to said plurality of memory cells and responsive to said detecting means for shifting the data signal stored in said first memory cell to said second memory cell through said bit lines, wherein said shifting means includes
address input means for externally receiving first and second row address signals for specifying said first and second memory cells, said first and second row address signals being provided to said address input means in time division of one memory cycle, third specifying means connected to said address input means and responsive to said first and second row address signals for sequentially specifying said first and second memory cells, and means connected between said address input means and said third specifying means and responsive to said detecting means for sequentially providing said first and second address signals to said third specifying means in one memory cycle.

* * * * *